(12) United States Patent
Eldar et al.

(10) Patent No.: US 9,143,194 B2
(45) Date of Patent: Sep. 22, 2015

(54) LOW-RATE SAMPLING OF PULSE STREAMS

(75) Inventors: Yonina Eldar, Haifa (IL); Ronen Tur, Netanya (IL); Zvi Friedman, Kiryat Bialik (IL)

(73) Assignee: TECHNION RESEARCH & DEVELOPMENT FOUNDATION LTD., Haifa (IL)

( * ) Notice: Subject to any disclaimer, the term of this patent is extended or adjusted under 35 U.S.C. 154(b) by 907 days.

(21) Appl. No.: 13/041,455

(22) Filed: Mar. 7, 2011

(65) Prior Publication Data

US 2011/0225218 A1    Sep. 15, 2011

Related U.S. Application Data

(60) Provisional application No. 61/313,748, filed on Mar. 14, 2010.

(51) Int. Cl.
*H04B 1/7163* (2011.01)
*H03M 1/12* (2006.01)
*H03H 17/06* (2006.01)

(52) U.S. Cl.
CPC ............ *H04B 1/71637* (2013.01); *H03H 17/06* (2013.01); *H03M 1/1245* (2013.01)

(58) Field of Classification Search
CPC ....................................................... H03H 17/06
USPC ......................................................... 708/300
See application file for complete search history.

(56) References Cited

U.S. PATENT DOCUMENTS

| 5,280,636 | A  | 1/1994  | Kelley et al.   |
|-----------|----|---------|-----------------|
| 5,414,623 | A  | 5/1995  | Lu et al.       |
| 5,812,605 | A  | 9/1998  | Smith et al.    |
| 6,018,600 | A  | 1/2000  | Levin et al.    |
| 6,806,708 | B1 | 10/2004 | Lee et al.      |
| 7,280,615 | B2 | 10/2007 | Roberts         |
| 7,636,403 | B2 | 12/2009 | Eldar et al.    |
| 7,652,608 | B1 | 1/2010  | Mathis et al.   |
| 7,751,469 | B2 | 7/2010  | Eldar et al.    |
| 7,888,900 | B2 | 2/2011  | Okamoto et al.  |
| 8,032,085 | B2 | 10/2011 | Mishali et al.  |

(Continued)

FOREIGN PATENT DOCUMENTS

| WO | 2009021247 A1 | 2/2009 |
| WO | 2010/095083 A1 | 8/2010 |

OTHER PUBLICATIONS

Julius Smith III, Digital Audio Resampling Home PAge, Stanford University, Center for Computer Research in Music and Acoustics, 2005, pp. 1-19.*

(Continued)

*Primary Examiner* — Chuong D Ngo
(74) *Attorney, Agent, or Firm* — D. Kligler I.P. Services Ltd.

(57) ABSTRACT

A method includes accepting an analog input signal that includes a sequence of pulses. The analog input signal is filtered so as to produce a filter output, using a filter whose time-domain response is confined to a finite time period and whose frequency-domain response is non-zero at a finite set of integer multiples of a frequency shift $\Delta\omega$, and is zero at all other integer multiples of $\Delta\omega$. The filter output is sampled so as to produce digital samples. Respective amplitudes and time positions of the pulses in the sequence are calculated based on the digital samples.

33 Claims, 2 Drawing Sheets

(56) References Cited

U.S. PATENT DOCUMENTS

| | | | |
|---|---|---|---|
| 2002/0003843 | A1 | 1/2002 | Maritone |
| 2004/0264634 | A1 | 12/2004 | Claus et al. |
| 2005/0141603 | A1* | 6/2005 | Miller .......................... 375/222 |
| 2005/0179585 | A1 | 8/2005 | Walker et al. |
| 2006/0009225 | A1 | 1/2006 | Herre et al. |
| 2006/0013597 | A1 | 1/2006 | Crivelli et al. |
| 2006/0217082 | A1 | 9/2006 | Fischer |
| 2008/0129560 | A1 | 6/2008 | Baraniuk et al. |
| 2008/0221711 | A1 | 9/2008 | Trainer |
| 2009/0190689 | A1* | 7/2009 | Blu et al. ....................... 375/285 |
| 2010/0010351 | A1* | 1/2010 | Jovanovic et al. ............ 600/447 |
| 2010/0178057 | A1 | 7/2010 | Shieh |
| 2011/0225218 | A1 | 9/2011 | Eldar et al. |
| 2012/0068867 | A1 | 3/2012 | Pagnanelli |

OTHER PUBLICATIONS

Kotelnikov, V.A., "On the transmission capacity of 'ether' and wire in electrocommunications", Proceedings of the first All-Union Conference on the technological reconstruction of the communications sector and the development of low-current engineering, Moscow, Russia, 1933.

Black et al., "Time interleaved converter arrays", IEEE International Conference on Solid-State Circuits, vol. XXIII, pp. 14-15 & 254, Feb. 13, 1980.

Eldar et al., "Filter bank reconstruction of bandlimited signals from nonuniform and generalized samples," IEEE Transactions on Signal Processing, vol. 48, No. 10, pp. 2864-2875, Oct. 2000.

Eldar et al., "A minimum squared-error framework for generalized sampling", IEEE Transactions on Signal Processing, vol. 54, No. 6, pp. 2155-2167, Jun. 2006.

Jeng, Y.C., "Digital spectra of nonuniformly sampled signals: a robust sampling time offset estimation algorithm for ultra high-speed waveform digitizers using interleaving", IEEE Transactions on Instrumentation & Measurement, vol. 39, No. 1, pp. 71-75, Feb. 1990.

Lin et al., "Periodically nonuniform sampling of bandpass signals", IEEE Transactions on Circuits & Systems—II: Analog & Digital Signal Processing, vol. 45, No. 3, pp. 340-351, Mar. 1998.

Tian et al., "Compressed sensing for wideband cognitive radios", IEEE Conference on Acoustics, Speech & Signal Processing, vol. 4, pp. IV1357-IV1360, Honolulu, USA, Apr. 15-20, 2007.

Davis et al., "Adaptive Greedy Approximations", Journal on Constructive Approximation, vol. 13, No. 1, pp. 57-98, year 1997.

Candes et al., "Decoding by Linear Programming", IEEE Transactions on Information Theory, vol. 51, No. 12, pp. 4203-4215, Dec. 2005.

Kruskal, J.B., "Three-way Arrays: rank and uniqueness of trilinear decompositions, with application to arithmetic complexity and statistics", Linear Algebra and its Applications, vol. 18, issue 2, pp. 95-138, year 1977.

Mondillo et al., "Handheld echocardiography: its use and usefulness", International Journal of cardiology, vol. 111, No. 1, pp. 1-5, year 2006.

Tropp et al., "Random Filters for Compressive Sampling and Reconstruction", IEEE International Conference on Acoustics, Speech and Signal Processing, pp. III872-III875, Toulouse, France, May 2006.

Unser et al., "A General Sampling Theory for Nonideal Acquisition Devices", IEEE Transactions on Signal Processing, vol. 42, No. 11, pp. 2915-2925, Nov. 1994.

Aldroubi et al., "Nonuniform Sampling and Reconstruction in Shift-Invariant Spaces", SIAM Journal, vol. 43, issue 4, pp. 585-620, Mar. 2001.

Eldar et al., "Nonideal Sampling and Interpolation From Noisy Observations in Shift-Invariant Spaces", IEEE Transactions on Signal Processing, vol. 54, No. 7, pp. 2636-2651, Jul. 2006.

Hou et al., "A new method for high resolution estimation of time delay", IEEE International Conference on Acoustics, Speech and Signal Processing, vol. 7, pp. 420-423, May 1982.

Senior et al., "Portable echocardiography: a review", British Journal of cardiology, vol. 13, No. 3, pp. 185-189, May/Jun. 2006.

Bienvenu et al., "Adaptivity to background noise spatial coherence for high resolution passive methods", IEEE International Conferences on Acoustics, Speech and Signal Processing, vol. 05, pp. 307-310, Apr. 1980.

Unser, M., "Splines: A Perfect Fit for Signal and Image Processing", IEEE Signal Processing Magazine, vol. 16, No. 6, pp. 22-38, Nov. 1999.

Unser et al., "Cardinal Exponential Splines: Part I—Theory and Filtering Algorithms", IEEE Transactions on Signal Processing, vol. 53, No. 4, pp. 1425-1438, Apr. 2005.

Maravic et al., "Sampling and reconstructions of signals with finite rate of innovation in the presence of noise", IEEE Transactions on Signal Processing, vol. 53, No. 8, pp. 2788-2805, Aug. 2005.

Kusuma et al., "Multichannel Sampling of Parametric Signals with a Successive Approximation Property", IEEE International Conference in Image Processing, pp. 1265-1268, Oct. 2006.

Shan et al., "On Spatial Smoothing for direction-of-arrival estimation of coherent signals", IEEE Transactions on Acoustics, Speech and Signal Processing, vol. 33, No. 4, pp. 806-811, Aug. 1985.

Bresler et al., "Spectrum-blind minimum rate sampling and reconstruction of 2-D multi-band signals", IEEE International Conference on Image Processing, vol. 1, pp. 701-704, Switzerland, Sep. 1996.

Benedetto et al., "Gabor Systems and the balian-low theorem", Gabor Analysis and Algorithms: Theory and Applications, pp. 85-122, year 1998.

Feichtinger et al., "A Banach space of test functions for gabor analysis", Gabor Analysis and Algorithms: Theory and Applications, p. 123-170, year 1998.

Daubechies et al., "Painless nonorthogonal expansions", Journal of Mathematical Physics, vol. 27, No. 5, pp. 1271-1283, May 1986.

Christensen et al., "Pairs of dual gabor frame generators with compact support and desired frequency localization", Applied and Computational Harmonic Analysis, vol. 20, No. 3, pp. 403-410, May 2006.

Candes et al., "Near Optimal Signal Recovery from random projections: universal encoding strategies?", IEEE information Theory, vol. 52, No. 12, pp. 5406-5425, Dec. 2006.

Rudelson et al., "On Sparse Reconstruction from Fourier and Gaussian Measurements", Communications on Pure and Applied Mathematics, vol. 61, issue 8, pp. 1025-1045, year 2008.

Ron et al., "Frames and stable bases for shift-invariant subspaces of L2(Rd)", Canadian Journal of Mathematics, vol. 47, No. 5, pp. 1051-1094, year 1995.

Prete, V.D., "Estimates, decay properties, and computation of the dual function for gabor frames", Journal of Fourier Analysis and Applications, vol. 5, issue 6, pp. 545-562, year 1999.

Grochenig et al., "Note on b-slines, wavelet scaling functions, and gabor games", IEEE Transactions on Information Theory, vol. 49, No. 12, pp. 3318-3320, Dec. 2003.

Folland et al., "The uncertainty principle: a mathematical survey", Journal of Fourier Analysis and Applications, vol. 3, No. 3, pp. 207-238, year 1997.

Butzer et al., "A sampling theorem for duration-limited functions with error estimates", Information and Control, vol. 34, issue 1, pp. 55-65, May 1977.

Butzer et al., "Sampling theory for not necessarily band-limited functions: a historical overview", SIAM review, vol. 34, No. 1, pp. 40-53, Mar. 1992.

Grochenig, K., "Foundations of Time-Frequency Analysis", chapter 3.1 (pp. 36-41) and chapter 5.2 (pp. 92-97, year 2001.

Dragotti et al., "Sampling moments and reconstructing signals of finite rate of innovation: Shannon meets strang-fix", IEEE Transactions on Signal Processing, vol. 55, No. 5, pp. 1741-1757, May 2007.

Hua et al., "Matrix pencil method for estimating parameters of exponentially damped/undamped sinusoids in noise", IEEE Transactions on Acoustics, Speech and Signal Processing, vol. 38, No. 5, pp. 814-824, May 1990.

Kumaresan et al., "Estimating the angles of arrival of multiple plane waves", IEEE Transactions on Aerospace Electronic System, vol. AES19, No. 1, pp. 134-139, Jan. 1983.

(56) References Cited

OTHER PUBLICATIONS

Roy et al., "ESPRIT—estimation of signal parameters via rotational invariance techniques", IEEE Transactions on Acoustics, Speech and Signal Processing, vol. 37, No. 7, pp. 984-995, Jul. 1989.
Schmidt, E., "Multiple emitter location and signal parameter estimation", IEEE Transactions on Antennas & Propagation, vol. AP-34, No. 3, pp. 276-280, Mar. 1986.
International Application PCT/IB2010/050661 Search Report dated Jul. 15, 2010.
PCT Application PCT/IB2011/054384 filed Oct. 5, 2011.
PCT Application PCT/IB2011/051449 filed Apr. 5, 2011.
EP Application # 11156901.8 Extended Search Report dated Jul. 6, 2011.
Mishali et al., "Spectrum-blind reconstruction of multi-band signals", IEEE International Conference on Acoustics, Speech and Signal Processing, pp. 3365-3368, Las Vegas, USA, Mar. 31-Apr. 4, 2008.
"Cascaded 2-Tone, 3rd-Order Compression Point (IP3)", RF Cafe Website, downloaded from http://www.rfcafe.com/references/electrical/ip3.htm on Apr. 19, 2010.
Mishali et al., "Reduce and Boost: Recovering Arbitrary Sets of Jointly Sparse Vectors", IEEE Transactions on Signal Processing, vol. 56, No. 10, pp. 4692-4702, Oct. 2008.
Mishali et al., "Xampling—Part I: Practice", arXiv:0911.0519v1, Nov. 3, 2009.
Mishali et al., "The modulated wideband converter: online documentation and simulations", Jul. 10, 2009 (http://webee.technion.ac.il/Sites/People/YoninaEldar/Info/software/GUI/MWC_GUI.htm).
Calderbank et al., "Compressed Learning: Universal Sparse Dimensionality Reduction and Learning in the Measurement Domain", Feb. 13, 2009.
Candes, E. J., "The Restricted Isometry Property and Its Implications for Compressed Sensing", Feb. 27, 2008.
El-Chammas et al., "General Analysis on the Impact of Phase-Skew in Time-Interleaved ADCs", IEEE Transactions on Circuits and Systems—I: Regular papers, vol. 56, No. 5, pp. 902-910, May 2009.
Chen et al., "Modulated Wideband Converter with Non-Ideal Lowpass Filters", 2010 IEEE International Conference on Acoustics Speech and Signal Processing (ICASSP), pp. 3630-3633, Dallas, USA, Mar. 14-19, 2010.
Rauhut et al., "Average Case Analysis of Multichannel Basis Pursuit", 8th international conference on Sampling Theory and Applications, Marseille, France, May 18-22, 2009.
Eldar et al., "Robust Recovery of Signals From a Structured Union of Subspaces", IEEE Transactions on Information Theory, vol. 55, issue 11, pp. 5302-5316, Nov. 2009.
Fleyer et al., "Multirate Synchronous Sampling of Sparse Multiband Signals", arXiv:0806.0579v1 [cs.IT], Jun. 3, 2008.
Fudge et al., "A Nyquist Folding Analog-to Information Receiver", 42nd Asilomar Conference on Signals, Systems and Computers, pp. 541-545, Pacific Grove, USA, Oct. 26-29, 2008.
Gedalyahu et al., "Low Rate Sampling Schemes for Time Delay Estimation", arXiv:0905.2429v1 [cs.IT], May 14, 2009.
Gentile, K., "Introduction to Zero-Delay Clock Timing Techniques", Analog Device Application Note AN-0983, Rev.0, year 2008.
Li et al., "Quickest Spectrum Sensing in Cognitive Radio", 42nd Annual Conference on Information Sciences and Systems, pp. 203-208, Princeton, USA, Mar. 19-21, 2008.
Lu et al., "A Theory for Sampling Signals from a Union of Subspaces", IEEE Transactions on Signal Processing, vol. 56, issue 6, pp. 2334-2345, Jun. 2008.
Maxim Integrated Products, "Data Converters", year 2008.
Mini-Circuits, "Understanding VCO Concepts", Application Note AN-95-007, Revision , Aug. 21, 2009.
Mishali et al., "Blind Multiband Signal Reconstruction: Compressed Sensing for Analog Signals", IEEE Transactions on Signal Processing, vol. 57, No. 3, pp. 993-1009, Mar. 2009.
Mishali et al., "Expected RIP: Conditioning of the Modulated Wideband Converter", IEEE Information Theory Workshop, pp. 343-347, Taormina, Italy, Oct. 11-16, 2009.
Mishali et al., "From Theory to Practice: Sub-Nyquist Sampling of Sparse Wideband Analog Signals", arXiv:0902.4291v3 [cs.IT], Feb. 25, 2009.
Polo et al., "Compressive Wide-Band Spectrum Sensing", IEEE International Conference on Acoustics, Speech and Signal Processing, pp. 2337-2340, Taipei, Taiwan, Apr. 19-24, 2009.
Polo, Y.L., "Compressive Wideband Spectrum Sensing for Cognitive Radio Applications", Master of Science Thesis, Delft University of Technology, Nov. 28, 2008.
Ragheb et al., "A Prototype Hardware for Random Demodulation Based Compressive Analog-to-Digital Conversion", 51st Midwest Symposium on Circuits and Systems, pp. 37-40, Knoxville, USA, Aug. 10-13, 2008.
Texas Instruments Incorporated, "Data Converters", years 1995-2010.
Tropp et al., "Beyond Nyquist: Efficient Sampling of Sparse Bandlimited Signals", arXiv:0902.0026v2 [cs.IT], Jan. 31, 2009.
Tsai et al., "Correction of Mismatches in a Time-Interleaved Analog-to-Digital Converter in an Adaptively Equalized Digital Communication Receiver", IEEE Transactions on Circuits and Systems—I: Regular Papers, vol. 56, No. 2, pp. 307-319, Feb. 2009.
Wakin, M.B., "A Manifold Lifting Algorithm for Multi-View Compressive Imaging", Picture Coding Symposium, pp. 1-4, Chicago, USA, May 6-8, 2009.
Eldar et al., "Beyond Bandlimited Sampling", IEEE Signal Processing Magazine, vol. 26, issue 3, pp. 48-68, May 2009.
Eldar, Y., "Compressed Sensing of Analog Signals in Shift-Invariant Spaces", IEEE Transactions on Signal Processing, vol. 57, No. 8, pp. 2986-2997, Aug. 2009.
Eldar, Y., "Uncertainty Relations for Shift-Invariant Analog Signals", IEEE Transactions on Signal Processing, vol. 55, No. 12, pp. 5742-5757, Dec. 2009.
Yu et al., "Mixed-Signal Parallel Compressed Sensing and Reception for Cognitive Radio", IEEE International Conference on Acoustics, Speech and Signal Processing, pp. 3861-3864, Las Vegas, USA, Mar. 31-Apr. 4, 2008.
Zhang et al., "Compressive Sensing Based Ultra-wideband Communication System", IEEE International Conference on Communications, pp. 1-5, Dresden, Germany, Jun. 14-18, 2009.
Camarero et al., "Mixed Signal Clock-Skew Calibrator for Time Interleaved Analog-to-Digital Converters", IEEE Transactions on Circuits and Systems—I: Regular papers, vol. 55, No. 11, pp. 3676-3687, Dec. 2008.
Mendelson et al., "Uniform Uncertainty Principle for Bernouilli and Subgaussian Ensembles", arXiv: math/0608665v1, Aug. 27, 2006.
Laugesen, R.S., "Gabor Dual Spline Windows", Jun. 23, 2008.
Christensen et al., "Gabor windows supported on [−1,1] and compactly supported dual windows", BK21 Research Report, Jun. 24, 2009.
Prete, V., "On a Necessary Condition for B-Spline Gabor Frames", Ricerche di matematica, vol. 59, No. 1, pp. 161-164, Mar. 12, 2010.
Michaeli et al., "Optimization techniques in modern sampling theory", Convex Optimization in Signal Processing and Communications, Cambridge University Press, Mar. 16, 2009.
Ramani et al., "Nonideal Sampling and Regularization Theory", IEEE Transactions on Signal Processing, vol. 56, No. 3, pp. 1055-1070, Mar. 2008.
Blu et al., "Sparse sampling of signal innovations", IEEE Signal Processing Magazine, vol. 25, No. 2, pp. 31-40, Mar. 2008.
Tur et al., "Low Rate Sampling of Pulse Streams with Application to Ultrasound Imaging", arXiv:1003.2822v3 [cs.IT], Mar. 14, 2010.
Matusiak et al., "Sub-Nyquist Sampling of Short Pulses: Part I", arXiv:1010.3132v1 [cs.IT], Oct. 15, 2010.
Akhoundi Asl et al., "Multichannel Sampling of Signals with Finite Rate of Innovation", IEEE Signal Processing Letters, vol. 17, No. 08, pp. 762-765, Aug. 2010.
Seelamantula et al., "A Generalized Sampling Method for Finite-Rate-of-Innovation-Signal Reconstruction", IEEE Signal Processing Letters, vol. 15, pp. 813-816, year 2008.
Olkkonen et al., "Measurement and Reconstruction of Impulse Train by Parallel Exponential Filters", IEEE Signal Processing Letters, vol. 15, pp. 241-244, year 2008.

(56) References Cited

OTHER PUBLICATIONS

Gedalyahu et al., "Time-Delay Estimation From Low-Rate Samples: A Union of Subspaces Approach", IEEE Transactions on Signal Processing, vol. 58, No. 6, pp. 3017-3031, Jun. 2010.
Mishali et al., "Xampling: Signal Acquisition and Processing in Union of Subspaces", arXiv:0911.0519v2 [cs.IT], Sep. 25, 2010.
Mishali et al., "Xampling: analog to digital at sub-Nyquist rates", arXiv:0912.2495v1, Dec. 13, 2009.
Bajwa et al., "Identification of Underspread Linear Systems with Application to Super-Resolution Radar", arXiv:1008.0851v1 [cs.IT], Aug. 4, 2010.
Eldar et al., "Recovering Signals From Lowpass Data", arXiv:0907.3576v1, Jul. 21, 2009.
U.S. Appl. No. 13/144,086 Office Action dated Nov. 28, 2012.
International Application PCT/IB2011/051449 Search Report dated Nov. 14, 2011.
European Application # 08808014.8 Examination Report dated Apr. 19, 2010, 17 pages.
Venkataramani et al., "Further results on spectrum blind sampling of 2D signals", Proceedings of the 1998 International Conference on Image Processing (ICIP), vol. 2, pp. 752-756, Oct. 4, 1998.
Chen et al., "Theoretical results on sparse representations of multiple-measurement vectors", IEEE Transactions on Signal Processing, vol. 54, No. 12, pp. 4634-4643, Dec. 2006.
International Application PCT/IB2011/054384 Search Report dated Feb. 17, 2012.
Candes et al., "Compressed Sensing with Coherent and Redundant Dictionaries", May 14, 2010.
Mishali et al., "From Theory to Practice: Sub-Nyquist Sampling of Sparse Wideband Analog Signals", IEEE Journal of Selected Topics in Signal Processing, vol. 4, No. 2, pp. 375-391, Apr. 2010.
Smith et al., "Compressed Sampling for Pulse Doppler Radar", IEEE Radar Conference, pp. 887-892, May 10, 2010.
Pfander et al., "Sparsity in Time Frequency Representations", Journal of Fourier Analysis and Applications, vol. 16, No. 2, pp. 233-260, Aug. 4, 2009.
Matusiak et al., "Sub-Nyquist Sampling of Short Pulses: Theory", Apr. 11, 2011.
Chen et al., "A Sub-Nyquist Rate Sampling Receiver Exploiting Compressive Sensing", IEEE Transactions on Circuits and Systems—I: Regular papers, vol. 58, No. 3, pp. 507-520, Mar. 2011.
National Semiconductor Corporation, "A/D Converter—Definition of terms", Jan. 2000.
Tropp, J.A., "Algorithms for simultaneous spare approximation. Part II: Convex relaxation", Special Issue on Sparse Approximations in Signal and Image Processing, vol. 86, issue 3, pp. 589-602, Mar. 2006.
"Wireless LAN Medium Access Control (MAC) and Physical Layer (PHY) specifications: High-speed physical layer in the 5 GHz band," IEEE Standard 802.11a, year 1999.
Zverev, A.I. "Handbook of Filter Synthesis", p. 13, John Wily & Sons 1967.
Viterbi, A.J., "CDMA principles of spread spectrum communication," Addison-Wesly Wireless Communications Series, 1995.
Kohlenberg, A., "Exact interpolation of band-limited functions", Journal of Applied Physics, vol. 24, No. 12, pp. 1432-1435, Dec. 1953.
Dickson et al., "An 80-Gb/s 231—1 pseudorandom binary sequence generator in SiGe BiCMOS technology", IEEE Journal on Solid-State Circuits, vol. 40, No. 12, pp. 2735-2745, Dec. 2005.
Razavi, B., "A 60-GHz CMOS receiver front-end", IEEE Journal of Solid-State Circuits, vol. 41, No. 1, pp. 17-22, Jan. 2006.
Shannon, C.E., "Communication in the presence of noise", Proceeding of IRE, vol. 86, No. 2, pp. 447-457, Feb. 1998 (reprinted from IRE proceedings vol. 37, pp. 10-21, 1949).
Hedge et al., "Random projections for manifold learning", Advances in Neural Information Processing Systems 20, pp. 641-648, year 2008.
Herley et al., "Minimum rate sampling and reconstruction of signals with arbitrary frequency support", IEEE Transactions on Information Theory, vol. 45, No. 5, pp. 1555-1564, Jul. 1999.
Kienmayer et al., "A low-power low-voltage NMOS bulk-mixer with 20 GHz bandwidth in 90 nm CMOS", Proceedings of the 2004 International Symposium on Circuits and Systems, vol. 4, Vancouver, Canada, May 23-26, 2004.
Wang et al., "A background timing-skew calibration technique for time-interleaved analog-to-digital converters", IEEE Transactions on Circuits & Systems—II: Express Briefs, vol. 53, No. 4, pp. 299-303, Apr. 2006.
Donoho et al., "Optimally sparse representation in general (nonorthogonal) dictionaries via l1 minimization", Proceedings of the National Academy of Science of USA, vol. 100, No. 4, pp. 2197-2202, Mar. 4, 2003.
Donoho, D.L., "Compressed sensing", IEEE Transactions on Information Theory, vol. 52, issue 4, pp. 1289-1306, Apr. 2006.
Candes et al., "Robust uncertainty principles: Exact signal reconstruction from highly incomplete frequency information", IEEE Transactions on Information Theory, vol. 52, No. 2, pp. 489-509, Feb. 2006.
Laskin et al., "A 60 mW per Lane, 4×23-Gb/s 27-1 PRBS Generator", IEEE Journal on Solid-State Circuits, vol. 41, No. 10, pp. 2198-2208, Oct. 2006.
Gardner, F., "Properties of frequency difference detectors", IEEE Transactions on Communications, vol. 33, No. 2, pp. 131-138, Feb. 1985.
Landau, H.J., "Necessary density conditions for sampling and interpolation of certain entire functions", Acta Mathematica, vol. 177, No. 1, pp. 37-52, Feb. 1967.
Johansson et al., "Reconstruction of nonuniformly sampled bandlimited signals by means of digital fractional delay filters", IEEE Transactions on Signal Processing, vol. 50, No. 11, pp. 2757-2767, Nov. 2002.
Nyquist, H., "Certain Topics in Telegraph Transmission Theory", Proceedings of the IEEE, vol. 90, No. 2, pp. 280-305, Feb. 2002 (reprinted from Transactions of A.I.E.E, vol. 47, No. 2, pp. 617-644, Apr. 1928).
Friis, H. T., "Noise figures of radio receivers", Proceedings of the IRE, vol. 32, No. 7, pp. 419-422, Jul. 1944.
Tropp, J. A., "Algorithms for simultaneous spare approximation. Part I: Greedy pursuit", Special Issue on Sparse Approximations in Signal and Image Processing, vol. 86, pp. 572-588, Apr. 2006.
Crols et al., "Low-IF topologies for high-performance analog front ends of fully integrated receivers", IEEE Transactions on Circuits & Systems—I: Analog and Digital Signal Processing, vol. 45, No. 3, pp. 269-282, Mar. 1998.
Elbornsson et al., "Blind equalization of time errors in a time-interleaved ADC system", IEEE Transactions on Signal Processing, vol. 53, No. 4, pp. 1413-1424, Apr. 2005.
Laska et al., "Theory and implementation of an analog-to-information converter using random demodulation", IEEE Proceedings of International Symposium on Circuits and Systems, pp. 1959-1962, New Orleans, USA, May 27-30, 2007.
Le et al., "Analog-to-digital converters", IEEE Signal Processing Magazine, vol. 22, No. 6, pp. 69-77, Nov. 2005.
Cotter et al., "Sparse solutions to linear inverse problems with multiple measurement vectors", IEEE Transactions on Signal Processing, vol. 53, No. 7, pp. 2477-2488, Jul. 2005.
Venkataramani et al., "Perfect reconstruction formulas and bounds on aliasing error in sub-Nyquist nonuniform sampling of multiband signals", IEEE Transactions on Information Theory, vol. 46, No. 6, pp. 2173-2183, Sep. 2000.
Unser, M., "Sampling—50 years after Shannon", Proceedings of the IEEE, vol. 88, No. 4, pp. 569-587, Apr. 2000.
Vetterli et al., "Sampling signals with finite rate of innovation", IEEE Transactions on Signal Processing, vol. 50, No. 6, pp. 1417-1428, Jun. 2002.
Mitoja, J., "Cognitive radio for flexible mobile multimedia communications", Mobile Networks and Applications, vol. 6, issue 5, pp. 435-441, Sep. 2001.

(56) References Cited

OTHER PUBLICATIONS

Alon et al., "Simple constructions of almost k-wise independent random variables", Proceedings of the 31st Annual Symposium on Foundations of Computer Science, vol. 2, pp. 554-553, St Louis, USA, Oct. 22-24, 1990.
Carvalho et al., "Compact formulas to relate ACPR and NPR to two-tone IMR and IP3", Microwave Journal, vol. 42, No. 12, Dec. 1999.
Boutin et al., "An arctangent type wideband PM/FM demodulator with improved performances", Proceedings of the 33rd Midwest Symposium on Circuits and Systems, pp. 460-463, Calgary, Canada, Aug. 12-14, 1990.
Feng et al., "Spectrum-blind minimum-rate sampling and reconstruction of multiband signals", Proceedings of IEEE International Conference on ASSP, vol. 2, pp. 1688-1691, May 1996.
Vaidyanathan et al., "Generalizations of the sampling theorem: Seven decades after Nyquist", IEEE Transactions on Circuits & Systems—I: Fundamental Theory and Applications, vol. 48, No. 9, pp. 1094-1109, Sep. 2001.
Welch et al., "The use of fast Fourier transform for the estimation of power spectra: A method based on time averaging over short, modified periodograms", IEEE Transactions on Audio and Electroacoustics, vol. 15, No. 2, pp. 70-73, Jun. 1967.
Baraniuk et al., "A simple proof of the restricted isometry property for random matrices," Constructive Approximation, Feb. 5, 2007.
Chen et al., "Atomic decomposition by basis pursuit", SIAM Review, vol. 43, No. 1, pp. 129-159, year 2001 (published originally in SIAM Journal on Scientific Computing, vol. 20, No. 1, pp. 33-61, Aug. 1998).
Huang et al., "Blind calibration of timing offsets for four-channel time-interleaved ADCs", IEEE Transactions on Circuits & Systems—I: Regular papers, vol. 54, No. 4, pp. 863-876, Apr. 2007.
Vaughan et al., "The theory of bandpass sampling", IEEE Transactions on Signal Processing, vol. 39, No. 9, pp. 1973-1984, Sep. 1991.
Walden, R.N., "Analog-to-digital converter survey and analysis", IEEE Journal on Selected Areas in Communication, vol. 17, No. 4, pp. 539-550, Apr. 1999.
Pickoltz et al., "Theory of Spread-Spectrum Communications—A Tutorial", IEEE Transactions on Communications, vol. 30, No. 5, pp. 855-884, May 1982.
U.S. Appl. No. 13/824,369 Office Action dated Feb. 13, 2014.
Proietti et al., "Low-Pass Filter Design using Locally Weighted Polynomial Regression and Discrete Prolate Spheroidal Sequences", MPRA paper # 15510, 25 pages, Jun. 4, 2009 (http://mpra.ub.uni-muenchen.de/15510/).
Mishali et al, "Efficient sampling of sparse wideband analog signals", IEEE 25th convention, pp. 290-294, Dec. 3, 2008.
TW Patent Application # 099105025 Office Action and Search report dated Jan. 13, 2015.
European Application # 10743458.1 Search Report dated Feb. 27, 2015.
Venkataramani et al., "Optimal Sub-Nyquist Nonuniform Sampling and Reconstruction for Multiband Signals", IEEE Transactions on Signal Processing, vol. 49, No. 10, pp. 2301-2313, Oct. 1, 2001.

\* cited by examiner

LOW-RATE SAMPLING OF PULSE STREAMS

CROSS-REFERENCE TO RELATED APPLICATIONS

This application claims the benefit of U.S. Provisional Patent Application 61/313,748, filed Mar. 14, 2010, whose disclosure is incorporated herein by reference.

FIELD OF THE INVENTION

The present invention relates generally to signal sampling, and particularly to methods and systems for sampling pulse streams.

BACKGROUND OF THE INVENTION

Reception and reconstruction of analog pulse sequences are performed in a wide variety of applications, including processing of neuronal signals, bio-imaging, image processing, radar systems and Ultra-Wideband (UWB) communication. Various methods for sampling and reconstruction of analog pulse sequences are known in the art. Example schemes are described, for example, by Vetterli et al., in "Sampling Signals with Finite Rate of Innovation," IEEE Transactions on Signal Processing, volume 50, no. 6, June, 2002, pages 1417-1428, which is incorporated herein by reference. Other example schemes are described by Blu et al., in "Sparse Sampling of Signal Innovations," IEEE Signal Processing Magazine, volume 25, no. 2, March, 2008, pages 31-40, which is incorporated herein by reference.

Some sampling schemes sample finite sequences of pulses. Example methods are described in Vetterli et al., cited above; and by Maravic and Vetterli, in "Sampling and Reconstruction of Signals with Finite Rate of Innovation in the Presence of Noise," IEEE Transactions on Signal Processing, volume 53, no. 8, August, 2005, pages 2788-2805; by Dragotti et al., in "Sampling Momemnts and Reconstructing Signals of Finite Rate of Innovation: Shannon Meets Strang-Fix," IEEE Transactions on Signal Processing, volume 55, no. 5, May, 2007, pages 1741-1757; and by Seelamantule and Unser, in "A Generalized Sampling Method for Finite-Rate-of-Innovation-Signal Reconstruction," IEEE Signal Processing Letters, volume 15, 2008, pages 813-816, which are all incorporated herein by reference.

SUMMARY OF THE INVENTION

An embodiment of the present invention that is described herein provides a method, which includes accepting an analog input signal including a sequence of pulses. The analog input signal is filtered so as to produce a filter output, using a filter whose time-domain response is confined to a finite time period and whose frequency-domain response is non-zero at a finite set of integer multiples of a frequency shift $\Delta\omega$, and is zero at all other integer multiples of $\Delta\omega$. The filter output is sampled so as to produce digital samples. Respective amplitudes and time positions of the pulses in the sequence are calculated based on the digital samples.

In some embodiments, the frequency-domain response of the filter is representable as a finite sum of multiple frequency-shifted replicas of a filtering function, wherein the filtering function is zero at all the integer multiples $n \cdot \Delta\omega$ of the frequency shift $\Delta\omega$, except n=0. In an embodiment, the filtering function includes a normalized sinc function. In a disclosed embodiment, the frequency-shifted replicas in the finite sum are weighted with respective weight coefficients. The weight coefficients may be chosen so as to optimize estimation of the amplitudes and the time positions when the digital samples are distorted by noise.

In another embodiment, filtering the input signal and sampling the filter output include processing the input signal using a single processing channel that includes a single filter and a single sampler. In yet another embodiment, calculating the amplitudes and the time positions includes applying an annihilating filter to the digital samples. In a disclosed embodiment, sampling the filter output includes digitizing the filter output at uniformly-spaced sampling intervals. Alternatively, sampling the filter output includes digitizing the filter output at non-uniformly-spaced sampling intervals.

In some embodiments, the input signal is infinite and periodic. In other embodiments, the input signal is confined to a finite time interval. In an example embodiment, filtering the input signal includes applying to the input signal a superposition of two or more instances of the filter that are shifted in time relative to one another by respective multiples of the finite time interval. In yet another embodiment, the pulses in the input signal are confined to bursts, such that each burst is confined to a finite time interval, and filtering the input signal includes applying to the input signal, separately in each burst, a superposition of two or more instances of the filter that are shifted in time relative to one another by respective multiples of the finite time interval.

In some embodiments, accepting the input signal includes receiving multiple ultrasound echo pulses that are reflected from tissue, and the method includes outputting the amplitudes and the time positions of the echo pulses so as to diagnose the tissue based on the amplitudes and the time positions. In some embodiments, accepting the input signal includes receiving at least one signal type selected from a group of types consisting of an ultrasound signal, a communication signal, a radar signal, a biological signal and an image signal, which carries the sequence of the pulses.

There is additionally provided, in accordance with an embodiment of the present invention, apparatus including an input interface and a sampling unit. The input interface is configured to accept an analog input signal including a sequence of pulses. The sampling unit includes a filter whose time-domain response is confined to a finite time period and whose frequency-domain response is non-zero at a finite set of integer multiples of a frequency shift $\Delta\omega$, and is zero at all other integer multiples of $\Delta\omega$. The sampling unit is configured to filter the analog input signal using the filter so as to produce a filter output, and to sample the filter output so as to produce digital samples.

The present invention will be more fully understood from the following detailed description of the embodiments thereof, taken together with the drawings in which:

DETAILED DESCRIPTION OF EMBODIMENTS

Overview

Figure 1:
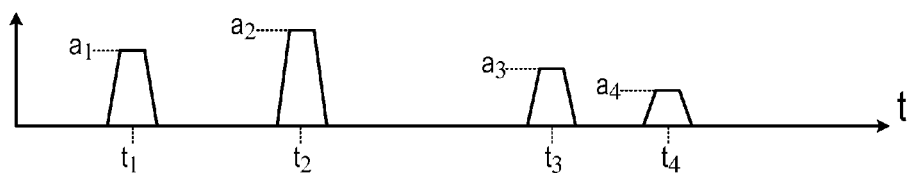
FIG. 1 is a graph showing an input signal comprising a sequence of analog pulses, in accordance with an embodiment of the present invention.

Embodiments of the present invention that are described herein provide improved methods and systems for sampling sequences of analog pulses. These methods and systems use a novel class of sampling kernels, or pre-sampling filters, whose time-domain response is limited (i.e., confined to a finite time period) and whose frequency-domain response is non-zero at a finite set of integer multiples of a frequency shift $\Delta\omega$, and is zero at all other integer multiples of $\Delta\omega$.

In some embodiments, the frequency-domain response of the filter at any given frequency $\omega$ is representable as a finite sum of multiple frequency-shifted replicas of a certain filtering function. The filtering function is zero at all integer multiples $n \cdot \Delta\omega$ for some frequency shift $\Delta\omega$, except $n=0$. In some disclosed embodiments, the sampling kernel is representable as a finite sum of normalized sinc functions of the form $\sin(\pi\omega)/(\pi\omega)$. These latter filters are referred to herein as "Sum-of-Sincs" (SoS) filters.

In some embodiments, a sampling and reconstruction system accepts an analog input signal that is made up of a sequence of pulses. The pulses in the signal have a known pulse shape but unknown amplitudes and time positions. The system filters the input signal using a filter whose response meets the above-described conditions, and then samples the filtered signal. As will be shown below, filtering the signal with such a filter prior to sampling enables the system to calculate the unknown pulse amplitudes and time positions from the sampled signal.

When using the disclosed filters, perfect reconstruction of the pulse amplitudes and time positions is possible even at very low sampling rates. For a periodic signal having L pulses per period, for example, reconstruction is possible for sampling rates of only 2L samples per period, even when the pulses occupy only a small fraction of the time. The filter parameters, e.g., the number of filtering functions and their relative weights in the sum, can be chosen to match various design goals.

Unlike some known sampling schemes, the disclosed techniques are numerically stable and resilient to noise for both small and large numbers of pulses. Moreover, the filters described herein are time-limited, and can therefore be used for sampling finite and a-periodic pulse sequences, as well. Example simulated test results of the disclosed techniques can be found in U.S. Provisional Patent Application 61/313, 748, cited above.

System Description

Embodiments of the present invention sample and reconstruct sequences of analog pulses. The sequences may be finite, infinite, periodic or a-periodic. Typically, the pulses in the sequence are of a known pulse shape but unknown amplitudes and time positions. This type of signals is sometimes referred to as having a Finite Rate of Innovation (FRI), since they have a finite number of degrees of freedom per unit time.

The methods and systems described herein apply FRI compressed-sensing techniques in ultrasound imaging, as well as in various other applications.

FIG. 1 is a graph showing an input signal comprising a sequence of analog pulses, in accordance with an embodiment of the present invention. The present example shows four pulses of the same known pulse shape. The four pulses have amplitudes $a_1 \ldots a_4$ and respective time positions $t_1 \ldots t_4$.

Figure 2:
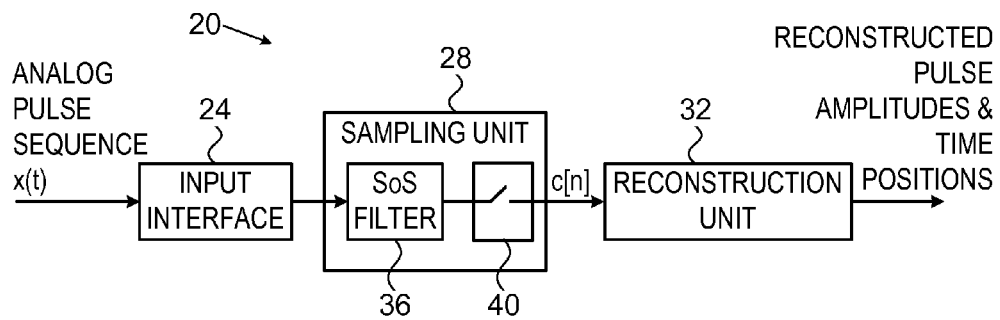
FIG. 2 is a block diagram that schematically illustrates a system for sampling and reconstruction of analog pulse sequences, in accordance with an embodiment of the present invention.

FIG. 2 is a block diagram that schematically illustrates a system 20 for sampling and reconstruction of analog pulse sequences, in accordance with an embodiment of the present invention. In various embodiments, system 20 may be used in any suitable application that involves processing of analog pulse sequences. Example applications include ultrasound imaging and other bio-imaging modalities, processing of neuronal signals or other biological signals, processing of radar signals, image processing and Ultra-Wideband (UWB) communication.

System 20 comprises an input interface 24, a sampling unit 28 and a reconstruction unit 32. Interface 24 accepts an analog input signal denoted x(t). The input signal comprises a sequence of analog pulses of a known pulse shape but unknown amplitudes and time positions (occurrence times). Sampling unit 28 samples the input signal efficiently using a low sampling rate, as will be explained in detail below. Unit 28 produces a stream of samples denoted c[n]. Reconstruction unit 32 processes the sample stream so as to reconstruct the amplitudes and time positions ($a_i$, $t_i$) of the pulses in x(t). Since the pulse shape of the pulses is known, the reconstructed amplitudes and time positions provide a complete representation of the analog signal x(t). The reconstructed amplitudes and time positions are typically provided as output.

In the disclosed embodiments, sampling unit 28 filters input signal x(t) using a filter 36, whose frequency-domain response at any given frequency $\omega$ is representable as a finite sum of multiple frequency-shifted replicas of a certain filtering function. The filtering function is non-zero at $\omega=0$, and zero at all other integer multiples of $\Delta\omega$.

In the present embodiment, the filter transfer function consists of a sum of a finite number of sinc functions. Filter 36 is therefore referred to as a "Sum-of-Sincs" (SoS) filter. The description that follows refers mainly to the use of SoS filters. In alternative embodiments, however, filter 36 may comprise any other suitable filter that meets the above-described condition.

The term "sinc function" in the present context refers to any function of the form sin(arg)/arg, wherein arg denotes the argument of the function. Unit 32 comprises a sampler 40, e.g., an Analog-to-Digital Converter (ADC), which samples the output of filter 36 to produce digital samples c[n]. In the present example system 20 comprises a single processing channel, including a single filter and a single sampler.

The system configuration of FIG. 1 is an example configuration, which is chosen purely for the sake of conceptual clarity. In alternative embodiments, any other suitable system configuration can be used. For example, in some embodiments system 20 performs sampling but not reconstruction, in which case unit 32 may be omitted.

The elements of system 20 may be implemented using hardware. Digital elements can be implemented, for example, in one or more off-the-shelf devices, Application-Specific Integrated Circuits (ASICs) or FPGAs. Analog elements can be implemented, for example, using discrete components and/or one or more analog ICs. Some system elements may be implemented, additionally or alternatively, using software running on a suitable processor, e.g., a Digital Signal Processor (DSP). Some system elements may be implemented using a combination of hardware and software elements. In one example embodiment, system 20 is implemented in a single device (e.g., IC), which accepts an analog pulse sequence as input and produces the pulse amplitudes and time positions as output.

When implementing the disclosed techniques using a programmable processor, the processor typically comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Efficient Sampling of Pulse Sequences

The disclosed techniques can be used for sampling and reconstructions of analog pulse sequences that may be periodic, a-periodic, finite or infinite. The following description addresses infinite periodic pulse sequences first, and later generalizes the techniques to other sequence types.

Consider a τ-periodic pulse sequence that is given by:

$$x(t) = \sum_{m \in \mathbb{Z}} \sum_{l=1}^{L} a_l h(t - t_l - m\tau) \quad [1]$$

wherein h(t) denotes a known pulse shape, τ denotes the known period of the signal, and $\{t_l, a_l\}_{l=1}^{L}$, $t_l \in [0,\tau)$, $a_l \in \mathbb{C}$, $l=1 \ldots L$ denote the unknown time positions and amplitudes of the pulses within the period. The signal thus has 2L degrees of freedom.

The disclosed techniques sample and reconstruct x(t) from a minimal number of samples. In many practical cases, the pulses in x(t) have a small temporal support. In other words, signal x(t) has non-zero amplitude in only a small fraction of the time. As such, sampling the signal directly and at uniform intervals has a high likelihood of missing the pulse positions and producing many zero samples. The disclosed techniques therefore typically sample the signal following suitable filtering, using either uniform or non-uniform sampling times.

Let f(t) denote the periodic continuation of the pulse shape h(t), i.e., $f(t) = \sum_{m \in \mathbb{Z}} h(t-m\tau)$. Using Poisson's well-known summation formula, f(t) can be written as:

$$f(t) = \frac{1}{\tau} \sum_{k \in \mathbb{Z}} H\left(\frac{2\pi k}{\tau}\right) e^{j2\pi kt/\tau} \quad [2]$$

wherein H(ω) denotes the Continuous-Time Fourier Transform (CTFT) of pulse h(t). (The CTFT of a signal x(t) is defined as $X(\omega) = \int_{-\infty}^{\infty} x(t) e^{-j\omega t} d\omega$). From Equations [1] and [2] we get:

$$x(t) = \ldots = \sum_{k \in \mathbb{Z}} X[k] e^{j2\pi kt/\tau} \quad [3]$$

wherein X[k] is given by:

$$X[k] = \frac{1}{\tau} H\left(\frac{2\pi k}{\tau}\right) \sum_{l=1}^{L} a_l e^{-j2\pi k t_l/\tau} \quad [4]$$

The expression in Equation [3] represents signal x(t) using a Fourier series expansion with the Fourier coefficients X[k] given in Equation [4]. The following description shows that if at least 2L of the Fourier coefficients of x(t) are known, the time positions and amplitudes $\{t_l, a_l\}_{l=1}^{L}$ of the pulses in x(t) can be recovered using known spectral analysis methods.

Define a set $\mathcal{K}$ of M consecutive indices such that $H(2\pi k/\tau) \neq 0, \forall k \in \mathcal{K}$. Such a set typically exists for short-time-support pulses h(t). Let H denote a M×M diagonal matrix whose $k^{th}$ diagonal element is $(1/\tau)H(2\pi k/\tau)$. Let V(t) denote an M×L matrix whose $kl^{th}$ element is $$e^{-\frac{j2\pi k t_l}{\tau}},$$

wherein $t=\{t_1, \ldots t_L\}$ denotes a vector of the unknown time positions of the pulses. Let a denote an L-element vector whose lth element is $a_l$, and x denote an M-element vector whose $k^{th}$ element is the Fourier coefficient X[k]. Equation [4] can thus be written in matrix form as:

$$x = HV(t)a \quad [5]$$

Since H is invertible by construction, we can define $y = H^{-1}x$ that satisfies:

$$y = V(t)a \quad [6]$$

Matrix V is a Vandermonde matrix and therefore has full column rank as long as M≥L and the time positions are distinct, i.e., $t_i \neq t_j$ for all i≠j. The $k^{th}$ element in vector y can be written explicitly as:

$$y_k = \sum_{l=1}^{L} a_l e^{-j2\pi k t_l/\tau} \quad [7]$$

Thus, given the vector x, Equation [6] above is the known problem of finding the frequencies and amplitudes of a sum of L complex exponentials. This problem can be solved as long as $|\mathcal{K}| = M \geq 2L$. The frequencies of the exponentials can be found using any suitable method. For example, the Vetterli at al. and Blu et al. articles, cited above, use an annihilating filter for this purpose.

The annihilating filter approach can extract the frequencies using only M=2L samples, and may therefore be useful in minimal-rate sampling applications. Nevertheless, any other suitable technique can also be used. One example technique is called MUSIC, and is described by Schmidt, in "Multiple Emitter Location and Signal Parameter Estimation," IEEE Transactions on Antennas and Propagation, volume 34, no. 3, March, 1986, pages 276-280, and by Bienvenu and Kopp, in "Adaptivity to Background Noise Spatial Coherence for High Resolution Passive Methods," IEEE International Conference on Acoustics, Speech and Signal Processing, volume 5, April, 1980, pages 307-310, which are incorporated herein by reference. Another example technique is called ESPRIT, and is described by Roy and Kailath, in "ESPRIT—Estimation of Signal Parameters via Rotational Invariance Techniques," IEEE Transactions on Acoustics, Speech and Signal Processing, volume 37, no. 7, July, 1989, pages 984-995, which is incorporated herein by reference.

The description above shows that spectral analysis methods (e.g., annihilating filter) can be used to calculate the time positions and amplitudes $\{t_l, a_l\}_{l=1}^{L}$ of the pulses in signal x(t) from a given vector x of M≥2L Fourier series coefficients. The following description shows that the Fourier series coefficients can be derived from the sample stream c[n], which is produced by sampling unit 28 using Sum-of-Sincs filtering followed by sampling.

The description below first develops a general condition on the sampling filter, and then proposes the SoS filter as an example filter that meets this condition. Although the embodiments described herein refer to sampling at uniform sampling intervals, the technique can be generalized in a straightforward manner to sampling at non-uniform intervals, as well.

Consider a signal x(t) that is sampled using a sampling kernel s*(−t) and a sampling period T (i.e., filtered with a filter whose time-domain impulse response is s*(−t), followed by sampling with sampling period T), to produce a sample stream c[n]. The * operator denotes complex conjugation. The samples c[n] are given by:

$$c[n] = \int_{-\infty}^{\infty} x(t)s^*(t-nT)dt = \langle s(t-nT), x(t)\rangle \quad [8]$$

wherein the $\langle \rangle$ operator denotes inner product, i.e., $\langle x(t), y(t)\rangle = \int_{-\infty}^{\infty} x^*(t)y(t)dt$. Substituting Equation [3] above into Equation [8] gives:

$$c[n] = \sum_{k \in \mathbb{Z}} X[k] e^{\frac{j2\pi k n T}{\tau}} S^*\left(\frac{2\pi k}{\tau}\right) \quad [9]$$

wherein $S(\omega)$ denotes the CTFT of s(t). Consider any filter s*(−t) that is chosen to satisfy the following condition:

$$S^*(\omega) = \begin{cases} 0 & \omega = \frac{2\pi k}{\tau}, \ k \notin \chi \\ \text{nonzero} & \omega = \frac{2\pi k}{\tau}, \ k \in \chi \\ \text{arbitrary} & \text{otherwise} \end{cases} \quad [10]$$

The frequency-domain response of such a filter is non-zero at a finite set of integer multiples of a frequency shift $\Delta\omega$ (in this case $\Delta\omega=2\pi/\tau$), and is zero at all other integer multiples of $\Delta\omega$. In some embodiments, pulse sequences can be sampled efficiently using filters whose frequency-domain response meets the condition of Equation [10] and whose time-domain response is limited (i.e., confined to a finite time period).

For a filter that is chosen in accordance with the condition of Equation [10], Equation [9] can be rewritten as:

$$c[n] = \sum_{k \in \chi} X[k] e^{-j2\pi k n T/\tau} S^*\left(\frac{2\pi k}{\tau}\right) \quad [11]$$

Note that unlike Equation [9], the sum in Equation [11] is finite. Note also that any real filter that satisfies Equation [10] will satisfy $k \in \chi \Rightarrow -k \in \chi$, and in addition $$S\left(\frac{2\pi k}{\tau}\right) = S^*\left(\frac{-2\pi k}{\tau}\right),$$

due to the conjugate symmetry of real filters.

Let S denote a M×M diagonal matrix whose $k^{th}$ diagonal element is $S^*(2\pi k/\tau)$ for all $k \in \chi$, and let c denote an N-element vector whose $n^{th}$ element is c[n]. Using this notation Equation [11] can be written as:

$$c = V(-t_s)Sx \quad [12]$$

wherein $t_s = \{nT : n=0 \ldots N-1\}$, and V is defined as in Equation [5] above but with a different parameter $t_s$ and dimensions N×M. Matrix S is invertible by construction. Since matrix V is a Vandermonde matrix, it is left-invertible as long as N≥M. Therefore, the vector of Fourier series coefficients can be calculated using:

$$x = S^{-1}V^\dagger(-t_s)c \quad [13]$$

wherein the † operator denotes Moore-Penrose pseudo-inverse. In the special case where N=M and T=τ/N, the recovery in Equation [13] becomes:

$$x = S^{-1}\text{DFT}\{c\} \quad [14]$$

In other words, the vector of Fourier series coefficients x is obtained by calculating a Discrete Fourier Transform (DFT) of the sample vector, followed by a correction matrix that is related to the sampling filter.

The above-described sampling scheme regards each sample c[n] as a linear combination of the coefficients of x. The sampling kernel s*(−t) is designed to pass the coefficients $X[k]$, $k \in \chi$, while suppressing the other coefficients X[k], $k \notin \chi$. This operation is equivalent to the condition of Equation [10]. Such a scheme ensures that each sample combination is linearly independent of the others. Therefore, the linear system of equations in Equation [12] has full column rank, which allows solving for the vector x. In order to extend this result for non-uniform sampling, the non-uniform sampling times are substituted for the elements of vector $t_s$ in Equation [13].

In some embodiments, filter 36 in sampling unit 28 comprises a Sum-of-Sincs (SoS) filter. In other words, the frequency-domain transfer function of filter 36 consists of a finite sum of multiple sinc functions. This sort of filter has two important features: The time positions and amplitudes of the pulses of the input signal can be extracted from the sampled output of the SoS filter using known spectral analysis methods. In addition, the SoS filter is time-limited, a property that enables using it for sampling finite pulse sequences and infinite a-periodic pulse sequences.

Figure 3:
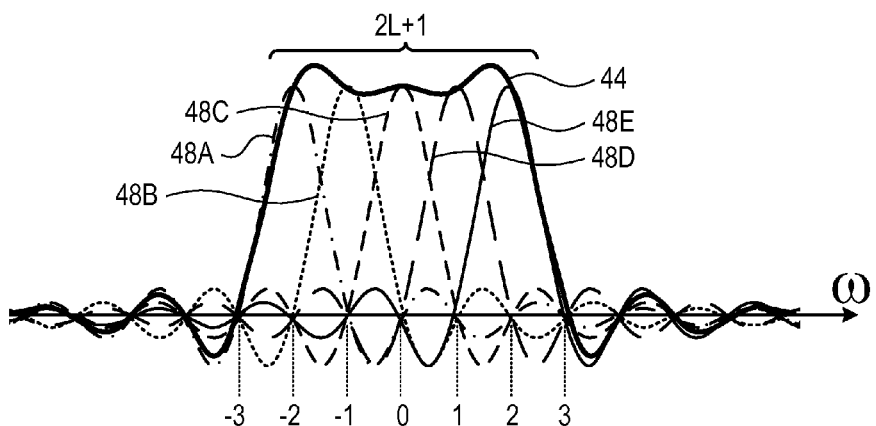
FIG. 3 is a graph showing a frequency-domain transfer function of a "sum-of-sincs" filter, in accordance with an embodiment of the present invention.

FIG. 3 is a graph showing a frequency-domain transfer function of a "sum-of-sincs" filter, in accordance with an embodiment of the present invention. A plot 44 shows the frequency-domain response of filter 36, which in the present example consists of a sum of five sinc functions 48A ... 48E. Each sinc function has a certain frequency shift, i.e., it is centered on a certain shifted frequency. In the present embodiment all five sinc functions have the same amplitude. In alternative embodiments, however, the sinc functions may have different amplitudes. In the present embodiment the filter transfer function is made up of a sum of five sinc functions. Alternatively, however, any other suitable number of sinc functions can be used.

Consider the following SoS filter transfer function in the frequency domain, which can be used to implement SoS filter 36:

$$G(\omega) = \frac{\tau}{\sqrt{2\pi}} \sum_{k \in \chi} b_k \operatorname{sinc}\left(\frac{\omega}{2\pi/\tau} - k\right) \quad [15]$$

wherein $b_k \neq 0, k \in \chi$. This filter is real-valued if and only if $k \in \chi \Rightarrow -k \in \chi$ and $b_k = b^*_{-k}$ for all $k \in \chi$. Since each individual sinc function in the sum satisfies $$sinc\left(\frac{\omega}{2\pi/\tau} - k\right) = \begin{cases} 1 & \omega = \frac{2\pi k'}{\tau}, \quad k' = k \\ 0 & \omega = \frac{2\pi k'}{\tau}, \quad k' \neq k \end{cases} \quad [16]$$

the overall SoS filter transfer function G(ω) satisfies the condition of Equation [10] by construction.

In the time domain, the response of the SoS filter is given by:

$$g(t) = rect(t/\tau) \sum_{k \in \varkappa} b_k e^{j2\pi kt/\tau} \quad [17]$$

where rect( ) denotes a unity rectangle function. As can be appreciated, the time-domain response in Equation [17] clearly is clearly time-limited, and has a finite temporal support τ.

The SoS filter transfer function can be extended to a more general structure:

$$G(\omega) = \frac{\tau}{\sqrt{2\pi}} \sum_{k \in \varkappa} b_k \phi\left(\frac{\omega}{2\pi/\tau} - k\right) \quad [18]$$

wherein $b_k \neq 0, k \in \varkappa$, and φ(ω) is any function satisfying:

$$\phi(\omega) = \begin{cases} 1 & \omega = 0 \\ 0 & |\omega| \in \mathbb{N} \\ \text{arbitrary} & \text{otherwise} \end{cases} \quad [19]$$

The function φ(ω) of Equation [19] is referred to as a filtering function. The frequency-domain response of the filtering function φ(ω), as a function of ω, is zero at all integer multiples of the frequency shift Δω, except for ω=0. The frequency-domain response G(ω) of filter 36 in Equation [18] is represented as a finite sum of multiple frequency-shifted replicas of the filtering function φ(ω).

This generalized structure allows for smoother versions of the rect functions, which may be advantageous for designing practical filters. When using either the SoS transfer function of Equation [15] or the generalized SoS transfer function of Equation [18], the function g(t) represents a class of filters that are determined by the parameters $\{b_k\}_{k \in \varkappa}$. The choice of parameters $b_k$ provides degrees of freedom in designing the filter to meet various specifications, design goals or trade-offs.

In some embodiments, a sampling filter having a temporal support τ can be designed by first defining a windowed Fourier series of the form:

$$\Phi(t) = rect(t/\tau) \sum_{k \in \mathbb{Z}} b_k e^{j2\pi kt/\tau}$$

Confining to filters that satisfy $b_k \neq 0, k \in \varkappa$, the summation can be truncated by choosing $$b_k = \begin{cases} \beta_k & k \in \varkappa \\ 0 & k \notin \varkappa \end{cases}$$

as the parameters of g(t) in Equation [17]. With this choice of parameters, g(t) can be viewed as an approximation of Φ(t). Choosing a larger number of parameters will typically provide a better approximation, but require more samples since N should be larger than the cardinality of set $\varkappa$, and vice versa. In one example implementation, $\varkappa = \{-p, \ldots, p\}$, and all coefficients $b_k$ are set to unity. In another example implementation, coefficients $b_k$ are chosen as a Hamming window of length M. In both cases the resulting filters are real-valued.

Example performance results for these filters are shown in U.S. Provisional Patent Application 61/313,748, cited above. In alternative embodiments, any other suitable filters can also be used. An example method for choosing coefficients $b_k$ in the presence of noise and associated design considerations are described further below.

Figure 4:
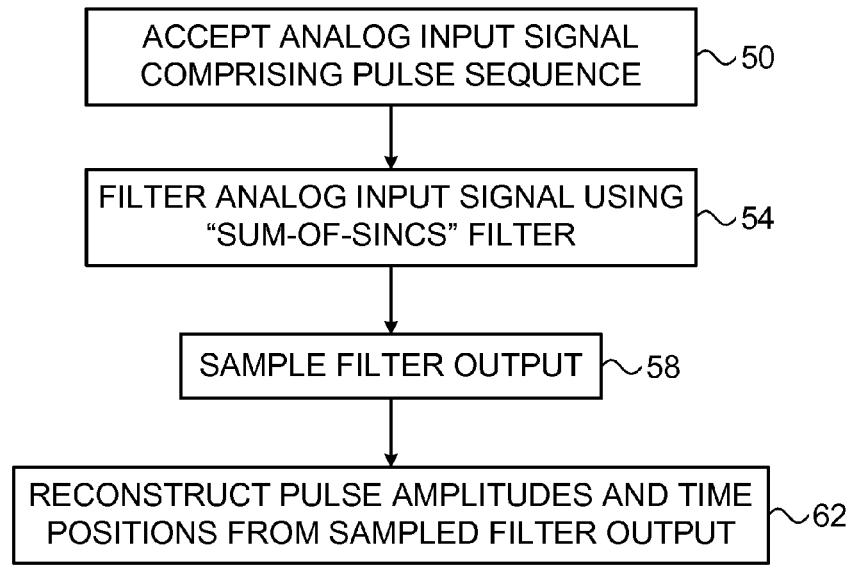
FIG. 4 is a flow chart that schematically illustrates a method for sampling and reconstruction of analog pulse sequences, in accordance with an embodiment of the present invention.

FIG. 4 is a flow chart that schematically illustrates a method for sampling and reconstruction of analog pulse sequences, in accordance with an embodiment of the present invention. The method begins with system 20 accepting an analog input signal via interface 24, at an input step 50. The analog input signal comprises a sequence of pulses having a known pulse shape but unknown time positions and amplitudes.

Sampling unit 28 of system 20 filters the analog input signal using SoS filter 36, at a filtering step 54. As explained above, the frequency-domain transfer function of filter 36 consists of a finite sum of multiple sinc functions. Following filtering, sampler 40 samples the output of filter 36, at a sampling step 58. The sampler samples the output of filter 36 at T intervals, to produce sample stream c[n].

In some embodiments, reconstruction unit 32 reconstructs the pulse amplitudes and time positions from the sample stream c[n], at a reconstruction step 62. Unit may use any suitable reconstruction scheme for this purpose, such as various known spectral analysis methods like annihilating filters. Unit 32 typically provides the reconstructed pulse amplitudes and time positions as output.

Sampling of Finite Pulse Sequences

In some embodiments, system 20 samples an analog input signal that includes a finite number of pulses in a finite time interval [0,τ). In these embodiments, sampling unit 28 filters the signal using a superposition of SoS filters that are shifted in time relative to one another by multiples of τ. With this filtering scheme, perfect reconstruction of the pulse amplitudes and time positions is possible with low sampling rate, high numerical stability and resilience to noise.

Consider the following input signal, which is confined to the finite time interval [0,τ) and includes L pulses:

$$\tilde{x}(t) = \sum_{l=1}^{L} a_l h(t - t_l), \, t_l \in [0, \tau), \, a_l \in \mathbb{R}, \, l = 1 \ldots L \quad [21]$$

wherein h(t) denotes a known pulse shape, and $\{t_l, a_l\}_{l=1}^{L}$ denote the unknown time positions and amplitudes of the pulses. The pulse shape h(t) is assumed to have a finite temporal support R, i.e., $h(t)=0, \forall |t| \geq R/2$. This assumption holds for most practical applications involving pulse signals.

Since x(t) in Equation [1] above (periodic analog signal case) is the periodic continuation of $\tilde{x}(t)$, x(t) can be written as a convolution between $\tilde{x}(t)$ and a Dirac comb (a comb of delta functions):

$$x(t) = \tilde{x}(t) * \sum_{m \in \mathbb{Z}} \delta(t - m\tau) \quad [22]$$

It can be shown that the samples of the periodic signal can be written as:

$$c[n] = \tilde{x}(t) * \tilde{g}(-t)|_{t=nT} \quad [23]$$

wherein $\tilde{g}(t) = \sum_{m \in \mathbb{Z}} g(t+m\tau)$. In other words, sampling the periodic signal x(t) with the filter g*(−t) is equivalent to sampling the finite a-periodic signal $\tilde{x}(t)$ with the filter $\tilde{g}$*(−t), which is the periodic continuation of g*(−t).

Therefore, sampling $\tilde{x}(t)$ using the periodic (infinite) sampling kernel $\tilde{g}$*(−t) would produce the same samples c[n] as in the periodic case for n=0 ... N−1. This approach, however, has little practical value since the sampling kernel has infinite energy and temporal support. It is possible, however, to exploit the properties of g(t) and h(t) to obtain a compact-support sampling kernel that produces the c[n] samples with little or no distortion.

Using Equation [9] above and using g*(−t) as the sampling kernel, c[n] in the periodic case can be written as:

$$c[n] = \langle g(t-nT), x(t) \rangle = \ldots = \sum_{m \in \mathbb{Z}} \sum_{l=1}^{L} a_l \varphi(nt - t_l - m\tau) \quad [24]$$

wherein $\varphi(v) = \langle g(t-v), h(t) \rangle$. Since g(t) in Equation [17] above vanishes for all $|t| > \tau/2$ and h(t) has a finite support R, the support of $\varphi$(t) is R+τ, i.e., $\varphi$(t)=0 for all $|t| \geq (R+\tau)/2$.

Using this property, the summation in Equation [24] is over non-zero values for indices that satisfy $|nT - t_l - m\tau| < (R+\tau)/2$. Sampling within the interval [0,τ), i.e., nT∈[0,τ), and noting that the time positions $t_1$ lie in this interval, we get:

$$\frac{R+\tau}{2} > |nT - t_l - m\tau| \geq |m|\tau - |nT - t_l| > (|m|-1)\tau \quad [25]$$

and therefore:

$$|m| < \frac{\frac{R}{\tau} + 3}{2} \Rightarrow |m| \leq \frac{\frac{R}{\tau} + 3}{2} - 1 \equiv r \quad [26]$$

In other words, the elements in the summation of Equation [24] vanish for all m except for the values in Equation [26]. Thus, the infinite sum in Equation [24] reduces to a finite sum over $|m| \leq r$. Equation [24] becomes:

$$c[n] = \left\langle \sum_{m=-r}^{r} g(t - nT + m\tau), \sum_{l=1}^{L} a_l h(t - t_l) \right\rangle \quad [27]$$

Let $g_r$(t) denote a sum of 2r+1 periods of g(t):

$$g_r(t) = \sum_{m=-r}^{r} g(t + m\tau) \quad [28]$$

The samples c[n] are given by:

$$\langle g_r(t-nT), \tilde{x}(t) \rangle \quad [29]$$

Thus, the samples c[n] can be obtained by filtering the a-periodic signal $\tilde{x}$(t) with the filter g*$_r$(−t) prior to sampling. This filter has a compact temporal support of (2r+1)τ.

Thus, in some embodiments, filter 36 in sampling unit 28 is designed to have the time-domain response given in Equation [28], i.e., a sum of time-shifted replicas of a SoS filter. Sampling using this filter enables perfect reconstruction of the time positions and amplitudes of the L pulses in the finite, a-periodic signal $\tilde{x}$(t), with a sampling rate as low as 2L.

In an example embodiment, the support R of h(t) satisfies R≤τ, such that r=1. Filter 36 in this embodiment consists of three periods of g(t):

$$g_{3p}(t) \equiv g_1(t) = g(t-\tau) + g(t) + g(t+\tau) \quad [30]$$

This filter can be implemented, for example, using delay lines whose delays are multiples of τ. In alternative embodiments, the finite, a-periodic signal can be sampled using any other suitable filter according to Equation [28], which may comprise any desired number of shifted replicas of g(t).

Sampling of Infinite a-Periodic Pulse Sequences

Under certain circumstances, the filters $g_r$(t) defined in Equation [28] can be used for sampling of infinite a-periodic pulse sequences of the form $z(t) = \sum_{m \in \mathbb{Z}} a_l h(t - t_l)$, $t_l, a_l \in \mathbb{R}$. Consider, for example, an infinite a-periodic pulse sequence in which the pulses appear in bursts. This signal has two distinct phases—bursts of maximal length τ containing at most L pulses each, and quiet phases between bursts.

In the present example, the pulse shape is a Dirac function, i.e., h(t)=δ(t), although any other suitable pulse shape can be used in alternative embodiments. When using Dirac pulses, the filter g*$_r$(−t) reduces to filter g*$_{3p}$(−t). Since filter g*$_{3p}$(−t) has a compact support of 3τ, the pulses in a given burst cannot influence samples that are acquired 3τ/2 seconds before or after the burst.

In the finite sequence case the samples were confined to the interval [0,τ). In the present case too, the samples are assumed to be acquired within the burst duration. Therefore, if the spacing between any two successive bursts in the signal is at least 3τ/2, any sample acquired in a give burst can only be influenced by the pulses of that burst and not by other bursts.

Figure 5:
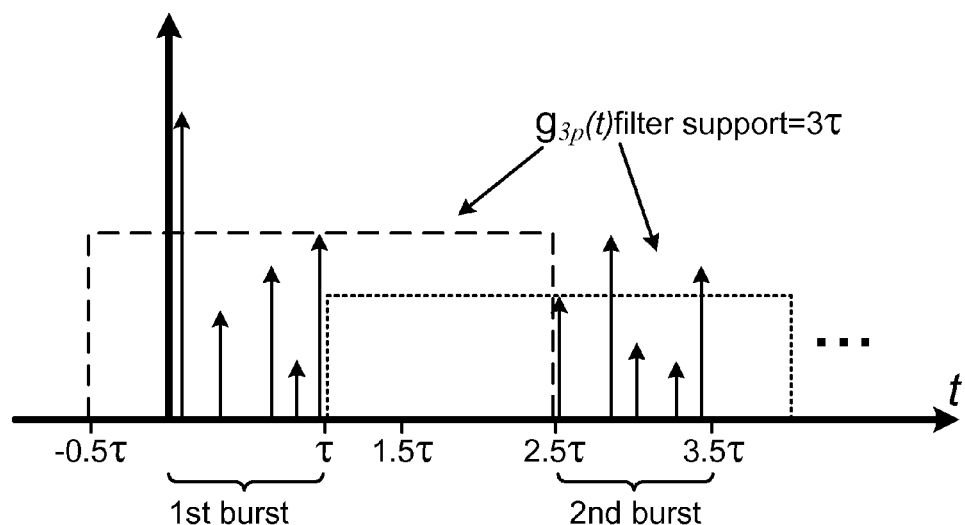
FIG. 5 is a graph showing a sampling scheme for sampling an infinite pulse sequence, in accordance with an embodiment of the present invention.

FIG. 5 is a graph showing a sampling scheme for sampling an infinite pulse sequence, in accordance with an embodiment of the present invention. The example of FIG. 5 shows two bursts belonging to an infinite a-periodic sequence of Dirac pulses. A $g_{3p}$(t) filter is shown around each burst, demonstrating that the samples in each burst are not affected by other bursts.

Under these conditions, the problem of sampling the infinite a-periodic pulses sequence is reduced to a sequential solution of multiple finite sequence sampling problems. Each of these finite sequences (bursts) can be sampled using the $g_{3p}$(t) filter, as described above. This solution assumes that the burst positions in the signal are known, in order to sample the bursts at the correct timing.

The burst positions can be assumed to be known in many practical applications, such as in synchronized communication applications in which the transmitter and receiver operate in accordance with a predefined frame structure, or in radar or imaging applications in which the pulses are transmitted and then received by the same unit. If the burst positions are not known, they can be determined using any suitable technique, for example using peak detection.

This result can be extended in a straightforward manner to general pulses h(t), as long as h(t) has a finite temporal support R and filtering is performed using filter g*$_r$(−t) and the appropriate choice of r from Equation [26]. If it is possible to choose a set $\mathcal{K}$ of consecutive indices for which $$H\left(\frac{2\pi k}{\tau}\right) \neq 0, \forall k \in \mathcal{K}$$

and the spacing between successive bursts is at least $((2r+1)\cdot\tau+R)/2$, then the above process can be used for sampling the infinite a-periodic pulse sequence.

Choosing Sum-of-Sincs Filter Coefficients in the Presence of Noise

As noted above, parameters $\{b_k\}_{k\in\mathcal{K}}$ of the SoS filter in Equation [15] above can be chosen in various ways to meet various design goals or specifications. In some embodiments, digital samples c[n] are distorted by noise, and filter parameters $\{b_k\}_{k\in\mathcal{K}}$ are selected so as to optimize estimation using the noisy samples. In the following example the filter parameters are chosen so as to minimize the estimation Mean Square Error (MSE), although various other optimization criteria can also be used.

Consider, for example, a scenario in which digital noise is added to samples c[n], so that the noisy sample vector is given by y=c+w, wherein w denotes a white Gaussian noise vector. Using Equation [12] above, we can write:

$$y = V(-t_s)Bx + w \quad [31]$$

wherein B denotes a diagonal matrix whose diagonal elements are $\{b_k\}$.

In the present example we assume that amplitudes $\{a_l\}$ are uncorrelated with variance $\sigma_a^2$, and that time positions $\{t_l\}$ are distributed uniformly in interval $[0,\tau)$. Since the noise is added to the samples after filtering, increasing the filter gain would artificially reduce the MSE. Therefore, we also normalize the filter energy by adding the constraint Tr(B*B)=1.

Under these assumptions, it can be shown that the estimation MSE is minimized by choosing the following parameters $\{b_k\}$:

$$|b_i|^2 = \begin{cases} \frac{\sigma^2}{N}\left(\sqrt{\frac{N}{\lambda\sigma^2}} - \frac{1}{|\tilde{h}_i|^2}\right) & \lambda \leq |\tilde{h}_i|^4 N/\sigma^2 \\ 0 & \lambda > |\tilde{h}_i|^4 N/\sigma^2 \end{cases} \quad [32]$$

wherein $$\tilde{h}_k = H\left(\frac{2\pi k}{\tau}\right)\sigma_a\sqrt{L}/\tau$$

and are arranged in ascending order of $|\tilde{h}_k|$, wherein $$\sqrt{\lambda} = \frac{(|\mathcal{K}|-m)\sqrt{N/\sigma^2}}{\frac{N}{\sigma^2} + \sum_{i=m+1}^{|\mathcal{K}|} 1/|\tilde{h}_i|^2} \quad [33]$$

and wherein m is the smallest index for which $\lambda \leq |\tilde{h}_{m+1}|^4 N/\sigma^2$.

Based on the above, it can be shown that if $|\tilde{h}_k|^2 = |\tilde{h}_l|^2 \forall k,l \in \mathcal{K}$, then the optimal filter parameters are $$|b_i|^2 = \frac{1}{|\mathcal{K}|}, \forall k \in \mathcal{K}$$

For example, for Dirac pulses (i.e., h(t)=δ(t)), the optimal choice of parameters is $b_k=b_j$ for all k and j.

Example Applications

As noted above, the disclosed techniques can be used for signal sampling and reconstruction in a wide variety of applications that process sequences of analog pulses. For example, in some imaging applications, a transmitter irradiates target tissue with a short ultrasound pulse. The pulse is reflected from various points in the tissue, due to variations in the acoustic impedance. Typically, reflections occur at boundaries between different tissue types. These reflections are sometimes referred to as ultrasound echoes.

The reflections are received, recorded and analyzed by a receiver. The reflections of a given pulse can be modeled as a finite sequence of pulses having a known pulse shape. The time positions of the pulses are indicative of the locations of the tissue type boundaries or other scatterers, and the pulse amplitudes are indicative of the differences in acoustic impedance between the tissue types. Both time positions and amplitudes are important for diagnosing the scanned tissue. In some embodiments, the disclosed techniques are used for sampling the ultrasound reflections and for calculating the pulse amplitudes and time positions. Example results of processing ultrasound reflections using the disclosed techniques are described in U.S. Provisional Patent Application 61/313,748, cited above.

The ultrasound imaging application is described purely by way of example. In alternative embodiments, the disclosed techniques can be used in any other suitable application, such as in other medical imaging applications, radar applications, communication applications, and many others. The particular design of input interface 24 may vary from one application to another, and typically depends on the type of signal that carries the pulse sequence (e.g., ultrasound signal, communication signal, radar signal, image signal or biological signal).

The embodiments described herein refer mainly to lowering the sampling rate at which the analog input signal (analog pulse sequence) is sampled. In alternative embodiments, however, the analog input signal can be sampled at a high sampling rate, and the sampled signal can then be filtered with the disclosed filters (e.g., SoS filter). A scheme of this sort is useful, for example, in applications where high sampling rate is tolerable but storage space or digital processing is to be reduced.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:
1. A method of analyzing signals from a target, comprising:
   accepting, by a filter, an analog input signal from the target, the analog input signal comprising a sequence of pulses, at unknown time positions;

filtering the analog input signal, by the filter, so as to produce a filter output having a form such that applying a spectral analysis method to samples of the filter output or to Fourier coefficients of the samples, provides respective amplitudes and time positions of the pulses in the sequence, wherein the filter has a time-domain response confined to a finite time period and has a frequency-domain response which is non-zero at a finite plurality of integer multiples of a frequency shift $\Delta\omega$, and is zero at all other integer multiples of $\Delta\omega$;

sampling the filter output, by a sampler, so as to produce digital samples;

calculating, by a processor, respective amplitudes and time positions of the pulses in the sequence based on the digital samples; and determining information on the target, responsive to the calculated amplitudes and time positions of the pulses, wherein the frequency-domain response of the filter is representable as a finite sum of multiple frequency-shifted replicas of a filtering function, wherein the filtering function is zero at all the integer multiples $n\cdot\Delta\omega$ of the frequency shift $\Delta\omega$, except n=0.

2. The method according to claim 1, wherein the filtering function comprises a normalized sinc function.

3. The method according to claim 1, wherein the frequency-shifted replicas in the finite sum are weighted with respective weight coefficients.

4. The method according to claim 3, wherein the weight coefficients of the frequency-shifted replicas are chosen so as to minimize a measure of noise in the calculated amplitudes and time positions when the digital samples are distorted by a specific noise model.

5. The method according to claim 1, wherein filtering the input signal and sampling the filter output comprise processing the input signal using a single processing channel that includes a single filter and a single sampler.

6. The method according to claim 1, wherein calculating the amplitudes and the time positions comprises deriving Fourier series coefficients from the digital samples and applying an annihilating filter to the Fourier series coefficients derived from the digital samples.

7. The method according to claim 1, wherein sampling the filter output comprises digitizing the filter output at uniformly-spaced sampling intervals.

8. The method according to claim 1, wherein sampling the filter output comprises digitizing the filter output at non-uniformly-spaced sampling intervals.

9. The method according to claim 1, wherein the input signal is infinite and periodic.

10. The method according to claim 1, wherein the input signal is confined to a finite time interval.

11. The method according to claim 10, wherein filtering the input signal comprises applying to the input signal a superposition of two or more instances of the filter that are shifted in time relative to one another by respective multiples of the finite time interval.

12. The method according to claim 1, wherein the pulses in the input signal are confined to bursts, such that each burst is confined to a finite time interval, and wherein filtering the input signal comprises applying to the input signal, separately in each burst, a superposition of two or more instances of the filter that are shifted in time relative to one another by respective multiples of the finite time interval.

13. The method according to claim 1, wherein accepting the input signal comprises receiving multiple ultrasound echo pulses that are reflected from tissue, and comprising outputting the amplitudes and the time positions of the echo pulses so as to diagnose the tissue based on the amplitudes and the time positions.

14. The method according to claim 1, wherein accepting the input signal comprises receiving at least one signal type selected from a group of types consisting of an ultrasound signal, a communication signal, a radar signal, a biological signal and an image signal, which carries the sequence of the pulses.

15. The method according to claim 1, wherein the frequency-domain response of the filter is non-zero at three or five integer multiples of a frequency shift $\Delta\omega$.

16. The method according to claim 1, wherein accepting the analog input signal comprises accepting a periodic signal having L pulses per period and sampling the filter output comprises sampling at a rate of 2L samples per period.

17. The method according to claim 1, wherein the pulses have a known pulse shape.

18. The method according to claim 1, wherein the pulses all have a same pulse shape, with same amplitudes or different amplitudes.

19. The method according to claim 1, comprising transmitting a signal towards the target and wherein accepting an analog input signal from the target comprises accepting an analog input signal reflected from the target responsively to the transmitted signal.

20. The method according to claim 1, wherein determining information on the target comprises imaging the target.

21. The method according to claim 1, wherein determining information on the target comprises determining information in accordance with a radar application.

22. Apparatus, comprising:
an input interface, which is configured to accept an analog input signal from a target comprising a sequence of pulses, at unknown time positions;
a filter having a time-domain response confined to a finite time period and whose frequency-domain response is non-zero at a finite plurality of integer multiples of a frequency shift $\Delta\omega$, and is zero at all other integer multiples of $\Delta\omega$, and which is configured to filter the analog input signal received by the input interface, and configured to provide a filter output having a form such that applying a spectral analysis method to samples of the filter output or to Fourier coefficients of the samples, provides respective amplitudes and time positions of the pulses in the sequence;
a sampler configured to sample the filter output so as to produce digital samples;
a reconstruction unit configured to calculate respective amplitudes and time positions of the pulses in the sequence based on the digital samples produced by the sampler; and
an output unit configured to output information on the target, responsive to the calculated amplitudes and time positions of the pulses,
wherein the frequency-domain response of the filter is representable as a finite sum of multiple frequency-shifted replicas of a filtering function, wherein the filtering function is zero at all the integer multiples $n\cdot\Delta\omega$ of the frequency shift $\Delta\omega$, except n=0.

23. The apparatus according to claim 22, wherein the filtering function comprises a normalized sinc function.

24. The apparatus according to claim 22, wherein the frequency-shifted replicas in the finite sum are weighted with respective weight coefficients.

25. The apparatus according to claim 24, wherein the weight coefficients are chosen so as to minimize a measure of noise in the amplitudes and the time positions calculated by the reconstruction unit when the digital samples are distorted by a specific noise model.

26. The apparatus according to claim 22, wherein the filter and sampler are included in a sampling unit which comprises a single processing channel including a single filter and a single sampler.

27. The apparatus according to claim 22, wherein the sampler is configured to sample the filter output at uniformly-spaced sampling intervals.

28. The apparatus according to claim 22, wherein the sampler is configured to sample the filter output at non-uniformly-spaced sampling intervals.

29. The apparatus according to claim 22, wherein the filter comprises a first filter and wherein the apparatus comprises an additional filter configured to filter the input signal with a superposition of the first filter shifted in time relative to the first filter by a finite time interval in which an intended input signal of the input interface is confined.

30. The apparatus according to claim 22, wherein the pulses in an intended input signal are confined to bursts, such that each burst is confined to a finite time interval, and wherein the apparatus is configured to apply to the input signal, separately in each burst, a superposition of two or more instances of the filter that are shifted in time relative to one another by respective multiples of the finite time interval.

31. The apparatus according to claim 22, wherein the input interface is configured to receive at least one signal type selected from a group of types consisting of an ultrasound signal, a communication signal, a radar signal, a biological signal and an image signal, which carries the sequence of the pulses.

32. The apparatus according to claim 22, wherein the reconstruction unit is configured to calculate the amplitudes and the time positions by applying an annihilating filter to the digital samples.

33. The apparatus according to claim 22, wherein the input interface is configured to receive multiple ultrasound echo pulses that are reflected from tissue, and wherein the reconstruction unit is configured to output the amplitudes and the time positions of the echo pulses so as to diagnose the tissue based on the amplitudes and the time positions.

* * * * *